United States Patent [19]
Mittel et al.

[11] Patent Number: 5,109,544
[45] Date of Patent: Apr. 28, 1992

[54] PAGING RECEIVER WITH AUTOMATIC FREQUENCY CONTROL

[75] Inventors: James G. Mittel, Boynton Beach; Walter L. Davis, Coral Springs; Sergio Fernandez, West Palm Beach; Lorenzo A. Ponce de Leon, Lake Worth; Kazimierz Siwiak, Coral Springs, all of Fla.

[73] Assignee: Motorola, Inc., Schaumburg, Ill.

[21] Appl. No.: 609,358

[22] Filed: Nov. 5, 1990

[51] Int. Cl.⁵ .............................. H04B 1/16
[52] U.S. Cl. ..................... 455/182.2; 455/192.2; 340/825.44
[58] Field of Search ............ 455/182, 192, 207, 209, 455/260, 264, 314–316, 340; 340/825.44

[56] References Cited

U.S. PATENT DOCUMENTS

| | | |
|---|---|---|
| 4,521,916 | 6/1985 | Wine ...................... 455/316 |
| 4,575,761 | 3/1986 | Carlson et al. ............. 455/182 |
| 4,817,197 | 3/1989 | Shimizu et al. ............. 455/316 |
| 4,875,038 | 10/1989 | Siwiak et al. ........... 340/825.44 |
| 4,903,332 | 2/1990 | Hansen .................... 455/340 |

Primary Examiner—Curtis Kuntz
Attorney, Agent, or Firm—Daniel R. Collopy; Vincent B. Ingrassia; Thomas G. Berry

[57] ABSTRACT

A receiver (200) includes an automatic frequency controller that determines the frequency of a receiver signal, and a calculates a frequency error from the received signal. The frequency error is used to calculate a correction factor (316) that is used to adjust the frequency of an oscillator (308) in response to the determined error.

17 Claims, 6 Drawing Sheets

PAGING RECEIVER WITH AUTOMATIC FREQUENCY CONTROL

FIELD OF THE INVENTION

This invention relates in general to automatic frequency control, and more specifically to receivers with automatic frequency control.

BACKGROUND OF THE INVENTION

The proliferation of cordless-communication devices has placed a severe strain on spectrum availability because most of the available "low-frequency" spectrum (i.e., spectrum below 900 MHz) has already been assigned. With the increasing demand for better communication systems, designers are forced to design and build systems at higher frequencies. However, with higher frequency designs come new problems, such as the stability and accuracy of a reference oscillator.

Figure 1:
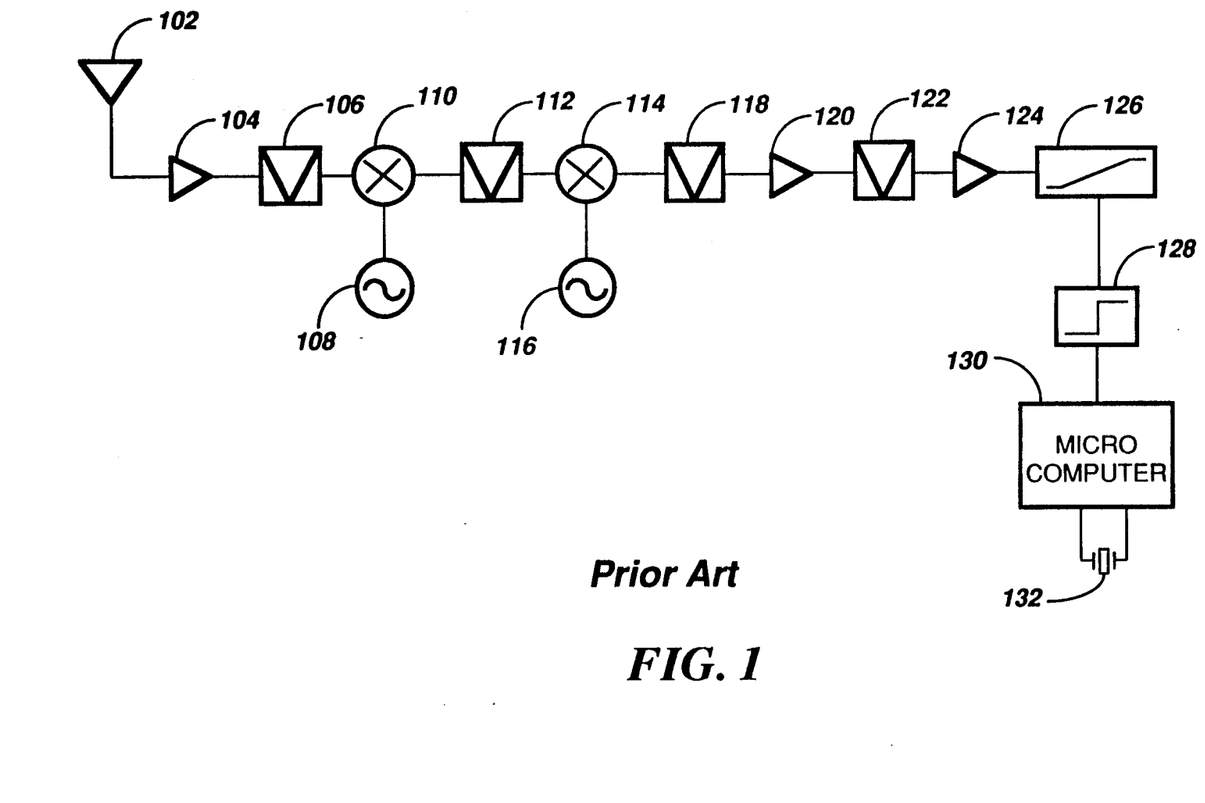
FIG. 1 is a block diagram of a conventional receiver using reference crystal oscillators.

A block diagram of a typical dual conversion receiver is shown in FIG. 1, the operation and components of which are well known to those skilled in the art. This figure is referenced for delineating some of the obstacles that need to be addressed in a higher frequency system. Typically, the bandwidth of the intermediate frequency (IF) filter(s) 112, 118, 122 is small compared to the high frequency received signal. Therefore, to maintain proper operation, the requirements of the first local oscillator 108 become extreme in terms of temperature coefficient and frequency stability. For example, if the bandwidth of the IF filter 112 is 12 kHz, and the one-sided signal deviation is 5 kHz, then it is desirable to keep the frequency drift to less than plus-or-minus 2 kHz to prevent the signal from drifting out of the IF passband. For example, when the first injection signal is 855 MHz the signal must be held constant within a plus-or-minus 2 kHz, which results in approximately plus-or-minus 2.5 parts per million (ppm) crystal stability.

While such high frequency crystals are obtainable, the prices are often prohibitively high and require temperature compensation circuits to control the stability of the total oscillator circuit.

An alternative to using a high stability reference crystal is an Automatic Frequency Control (AFC) scheme. Conventional AFC schemes typically require a continuous wave (CW) signal to lock onto the carrier. Also, AFC circuits utilize a feedback control circuit that must be carefully designed to achieve loop stability over the operating temperature range and which also must withstand interference from spurious signals. Also, because conventional AFCs are coupled to the demodulator output, their operation is non-linear over temperature changes. Thus, a special temperature compensation circuit is generally required in a linear AFC circuit. This further sets a fundamental limit on the accuracy of any linear AFC. Using an AFC in this way is expensive, especially in low cost electronic devices such as selective call receivers. As a result, an AFC system has not been a cost effective solution for selective call receivers.

Thus, what is needed is an economical AFC scheme that increases the overall stability of a selective call receiver without the requirement of a high stability reference crystal oscillator.

SUMMARY OF THE INVENTION

Briefly according to the invention, a selective call receiver includes an automatic frequency controller that determines the frequency of a received signal, and calculates a frequency error from the received signal. The frequency error is used to calculate a correction factor that is used to adjust the frequency of an oscillator in response to the determined error.

DESCRIPTION OF A PREFERRED EMBODIMENT

Figure 2:
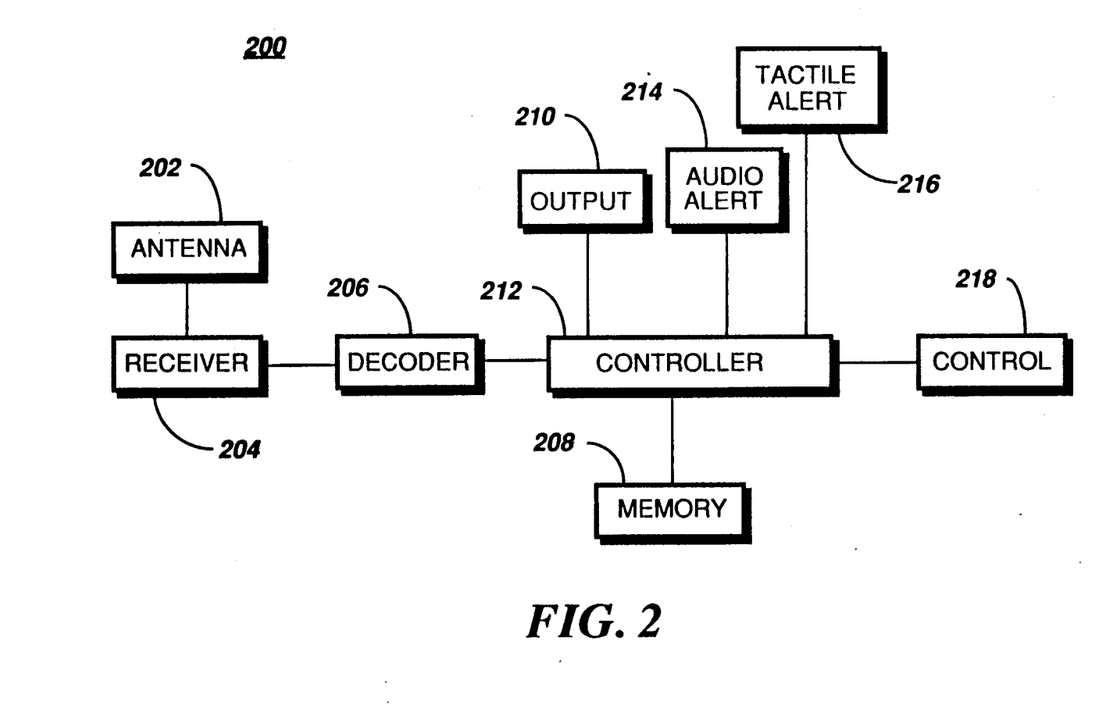
FIG. 2 is a block diagram of a selective call receiver suitable for use with the present invention.

Referring to FIG. 2, a selective call radio receiver 200 (e.g., a pager) comprises an antenna 202 that provides a radio frequency (RF) carrier signal that is mixed with a local oscillator signal contained within a receiver module 204. The receiver module 204 generates a recovered signal suitable for processing by a decoder 206 in a manner well known to those skilled in the art. The decoder 206 converts the signal to an address. A controller 212 compares the decoded address with one or more predetermined addresses contained in a memory 208. When the addresses are substantially similar, the user is alerted that a signal has been received either by an audio alert (e.g., speaker) 214 or a tactile alert (e.g., vibrator) 216. The received signal may also include optional message data directed to some selective call receivers. Also, if the selective call receiver includes an optional voice output, recovered audio components of the received R.F. signal may be presented. For a message or a voice selective call receiver, the recovered message or voice output is stored in a memory 208 for subsequent "playback" by an output module 210. The output module 210 will automatically, or when manually selected by controls 218, present the message, such as by displaying the message on a display.

Figure 3:
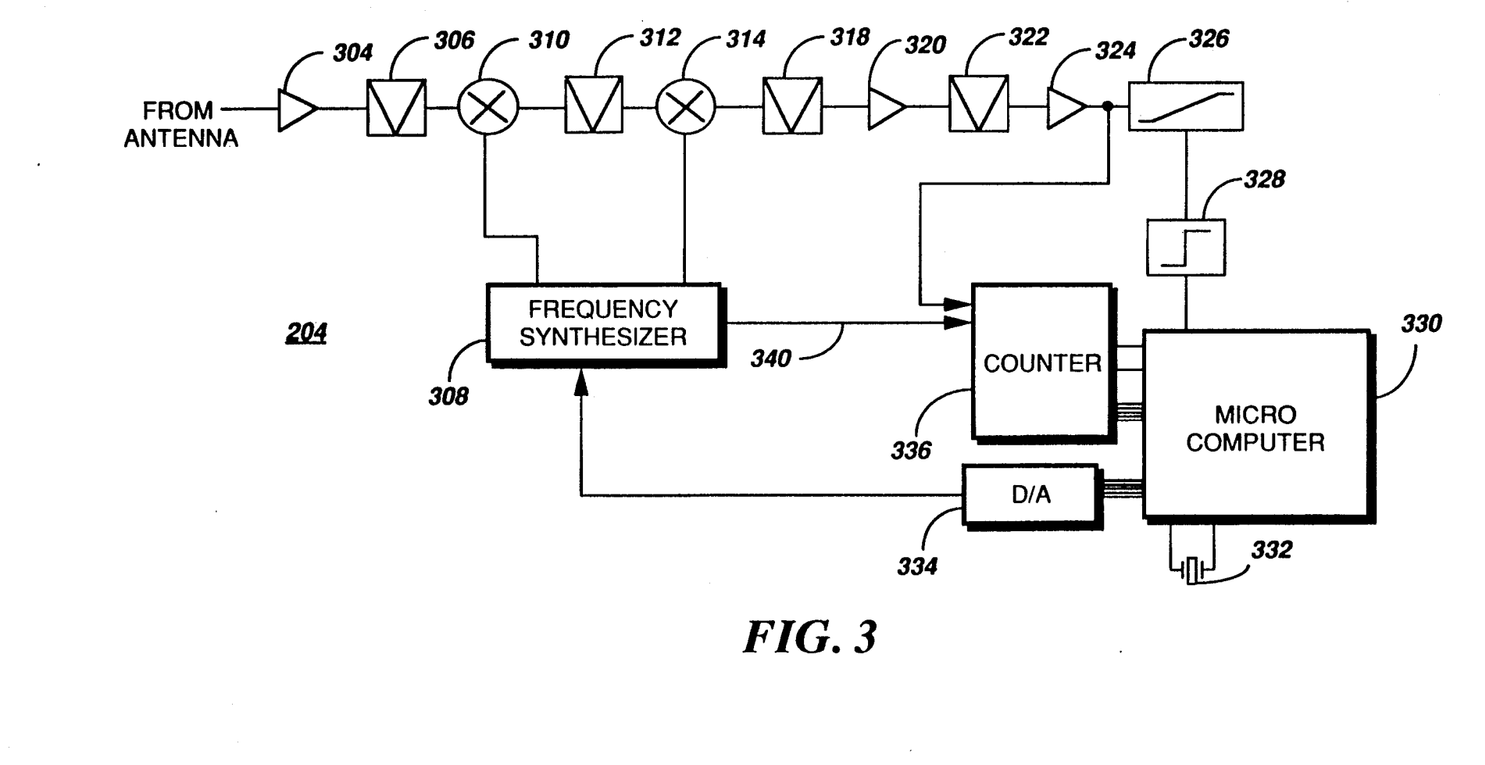
FIG. 3 is a block diagram of a receiver in accordance with the present invention.

According to the invention, FIG. 3 shows a receiver 204 that accepts signals from the antenna 202 for converting electromagnetic field energy into electrical energy that is amplified by the R.F. amplifier 304. A preselector filter 306 provides image frequency protection by preventing unwanted signals from reaching a first mixer 310. The first mixer 310 along with a signal from a frequency synthesizer 308 heterodynes the input signal down to an IF signal by a method known to those skilled in the art. The frequency synthesizer 308 includes a crystal oscillator (not shown) from which is derived a high stability reference signal 340 that is coupled to a counter 336. A first IF filter 312 eliminates unwanted signals, controls the receiver bandwidth, and provides a signal with the necessary adjacent channel sensitivity. This signal is converted by a second mixer 314 to a second IF frequency in a manner similar to the operation of the first mixer 310. A set of second IF filters 318, 322 control the bandwidth and the adjacent channel selectivity similar to the first IF filter 312. A set of second IF amplifiers/limiters 320, 324 provide the receiver gain and eliminate any amplitude modulated (AM) signals before the received signal reaches a demodulator 326. The demodulator 326 converts the IF signal to an audio voltage that is sent to a data limiter 328, which encodes the demodulated signal to digital levels.

According to the invention, a signal before the demodulator 326 is at a frequency that may be counted by a micro-computer 330 controlled by a low frequency reference crystal 332 (e.g., a value of 1.5 MHz or less). The micro-computer 330 controls a counter 336 that is used to measure the instantaneous frequency of the IF signal. The counter 336 provides an input to the micro-computer that is strobed (clocked) by the output signal from the data limiter 328. In this way, the micro-computer 330 can keep track of the transition of the received signal (e.g., determining the mark and space of an frequency shift keying (FSK) signal), thus permitting a count obtained over a predetermined time interval to be used to calculate the frequency of the signal. This count is realized in a conventional manner by counting the "high" signal and the "low" signal (i.e., the signals associated with the respective digital levels) and averaging the values to determine the frequency of the signal. The average between the "high" signal (mark) and the "low" signal (space) is used by the micro-computer 330 to calculate a correction factor via conventional techniques that is fed-back to the frequency synthesizer 308. Prior to frequency synthesizer block, the correction factor is first sent to the Digital-to-Analog converter (D/A) 334 that provides an analog signal that may vary the number of reference steps of the frequency synthesizer 308. In this way, the micro-computer obtains a count of the frequency in the IF side of the receiver, and computes a correction factor that depends on the frequency error in the count. The correction factor is then fed-back to the frequency synthesizer 308 in the RF portion of the receiver 204 to vary the injection frequency for correcting the signal received. This technique enables the receiver 204 to operate as if it is being controlled by an extremely accurate crystal oscillator with a good temperature stability.

Operationally, the invention incorporates a counter 336, a digital-to-analog converter 334, and a micro-computer 330 that, together, eliminate the need for a high accuracy crystal oscillator. The counter 336 counts the IF signal, while the micro-computer 330 keeps track of the ones and zeros pattern of the signal obtained after the data limiter 328. By combining the I.F. count obtained before the demodulator 326, and comparing it with the one-zero patterns obtained after the limiter 326, the micro-computer 330 will determine the data pattern (i.e., switching information) of the signal appearing at the antenna. For example, if the data received contains five ones (i.e., "highs") and four zeros (i.e., "lows"), and suppose:

$$ones = f_o + 4 \text{ kHz};$$

$$zeros = f_o - 4 \text{ kHz};$$

where fo is the reference frequency and the frequency deviation is 4 kHz.

The transmitted frequency (ftx) is calculated as follows:

$$ftx = (5*(f_o + 4 \text{ KHz}) + 4*(f_o - 4 \text{ kHz}))/9.$$

The ftx reduces approximately to:

$$ftx = f_o + (4 \text{ kHz})/9.$$

Thus, the transmitted frequency ftx is now used as the reference transmitter frequency, and not the reference frequency fo.

The micro-computer 330 incorporates a conventional Received Signal Strength Indicator (RSSI) (not shown) to determine when to measure the frequency of the received signal (i.e., when the received signal is above a predetermined signal-to-noise (S/N) threshold). An RSSI is a conventional electronic device that measures the signal strength of a received signal. In this way, the frequency is measured in a conventional manner by counting the "high" and "low" instantaneous frequency of the signal, and by removing deviation errors (averaging), an accurate determination of the nominal frequency is made.

Thus, by measuring the signal in the IF portion of the receiver where the frequency is significantly lower than the frequency of the RF signal, a relatively low tolerance and low accuracy crystal may be used instead of a high tolerance crystal oscillator. For example, if both the IF frequency and the time base crystal 332 oprates at 100 kHz, a plus-or-minus 100 ppm crystal would produce a plus-or-minus 10 Hz variation. This variation, when translated to the front-end of the receiver 204, results in approximately plus-or-minus 0.01 ppm variations. Additionally, if the IF frequency is, for example, 10 kHz, a plus-or-minus 100 ppm crystal would produce a plus-or-minus 1 Hz variation. This variation, when translated to the front-end of the receiver 204, results in approximately plus-or-minus 0.001 ppm variation. In this way, a low tolerance crystal oscillator may be used to achieved the performance of a extremely high accuracy crystal oscillator, and without the use of temperature compensation circuits. Also, choice of the IF frequency provides additional stability improvement without further increase in the actual stability of the crystal oscillator.

Figure 4:
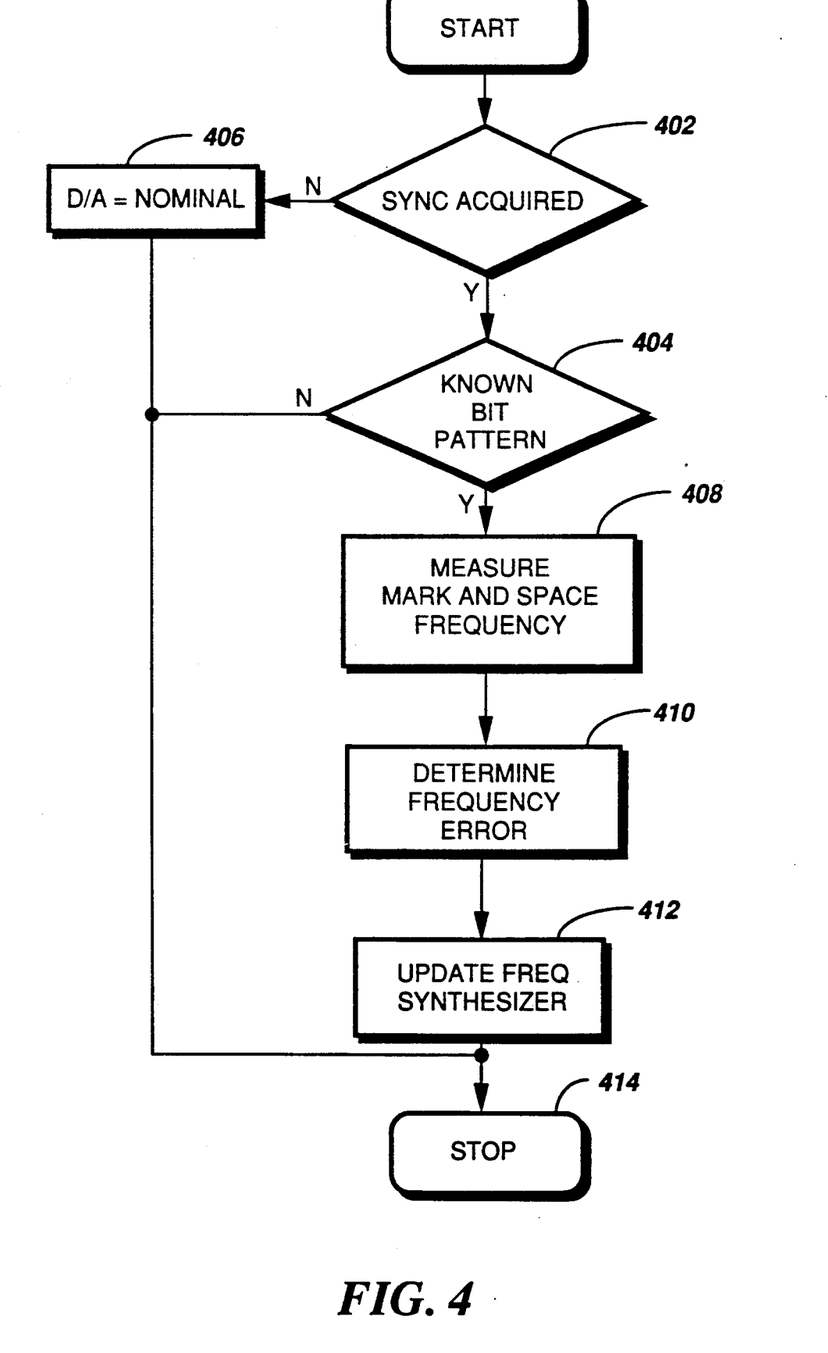
FIG. 4 is a flow diagram illustration of the operation of the receiver of FIG. 3 in accordance with the present invention.

The operation of a selective call receiver with a AFC is shown in the flow diagram of FIG. 4. According to the invention, after the signal is received, synchronization is attempted, step 402. If synchronization could not be acquired, a D/A converter is initialized to a nominal value, step 406, and the operation terminates, step 414. Alternately, if synchronization was acquired, the bit pattern is examined to determine if a valid addressed signal was received, step 404. If the bit pattern is unrecognizable, the operation terminates, step 414. However, upon receiving a valid address, the instantaneous frequency of the "high" frequency (mark) and the "low" frequency (space) are measured, step 408. The frequency error is determined from the average of both measurements and a correction factor is generated, step 410. The correction factor is subsequently sent to the frequency synthesizer to vary the frequency received, step 412. In this way, the frequency is measured by counting the "high" and "low" instantaneous frequency of the signal, and by removing deviation errors (i.e., averaging), an accurate determination of the nominal frequency is made. Furthermore, averaging the "high" and "low" measurements, the frequency measurement may be determined substantially faster, for example, at least two measurements may be sufficient for an "average frequency". Thus, by determining the correction necessary in the IF portion of the receiver, and feedingback this correction to the RF portion of the receiver, the receiver preforms as if it is being controlled by an extremely accurate crystal oscillator with a good temperature stability.

Figure 5:
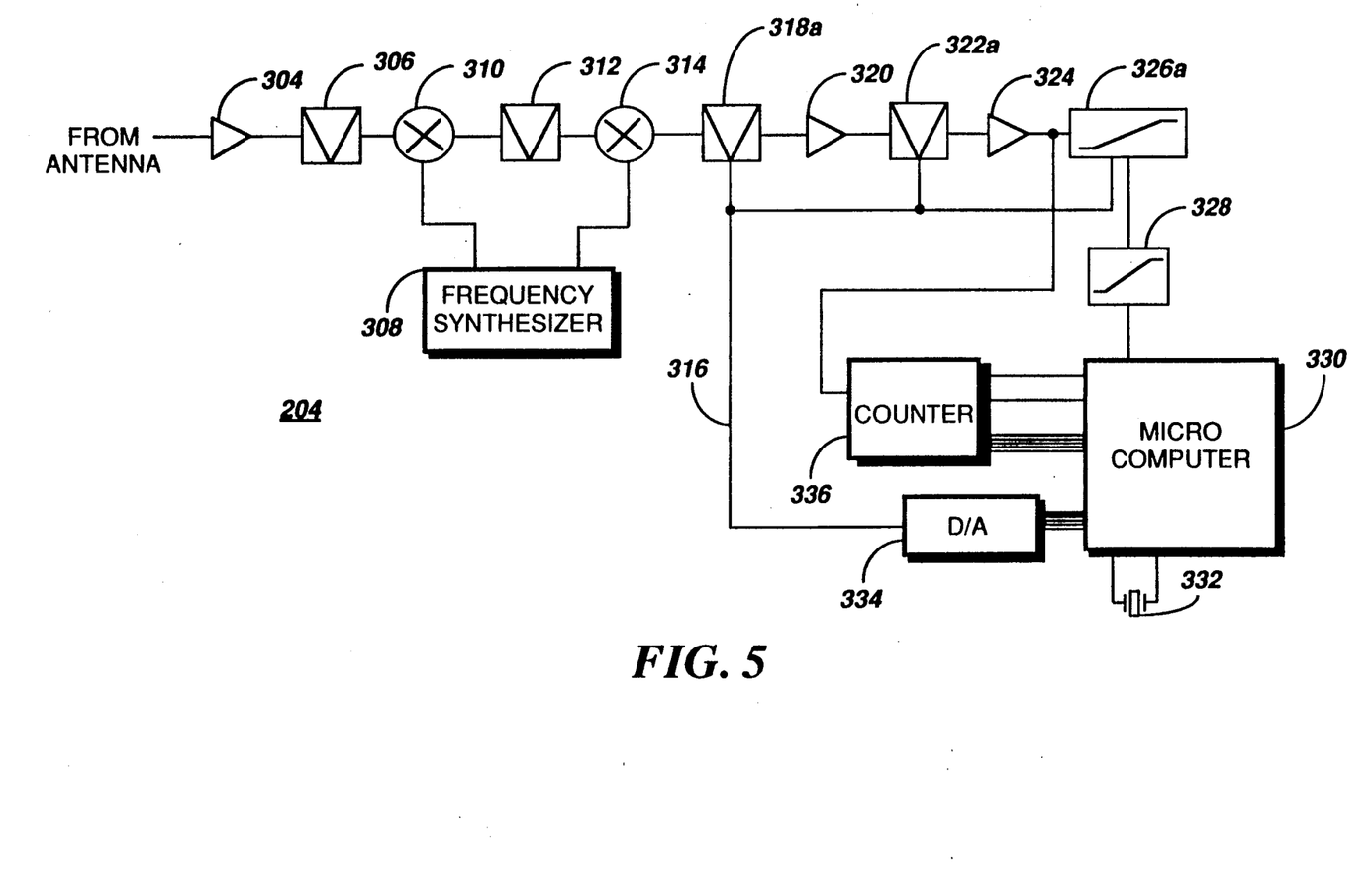
FIG. 5 is a block diagram of a receiver in accordance with a second embodiment of the invention.

Referring to FIG. 5, a second embodiment of the invention is illustrated. The operation is similar to the operation discussed in FIG. 3, but instead of using the correction factor determined by the micro-computer 330, as discussed in the first embodiment, for varying the frequency of the frequency synthesizer 308, the correction factor is used to vary the center frequency synthesizer 308, the correction factor is used to vary the center frequencies of the IF filters 318a, 322a, and the demodulator 326a. To do this, the micro-computer determines the frequency error of the received signal and sends a correction voltage that causes the IF filters 318a, 322a to vary its operating frequency in response to the correction voltage 316. In this way, a high frequency stability is achieved, because by determining the frequency of the IF signal, the frequency sensitive components of the second IF portion of the receiver may be "re-aligned" to the determined received frequency. Thus, by determining the correction necessary in the IF portion of the receiver, and changing the center frequency of IF components to received signal, the receiver similarly performs as if it is being controlled by an extremely accurate crystal oscillator with a good temperature stability.

Figure 6:
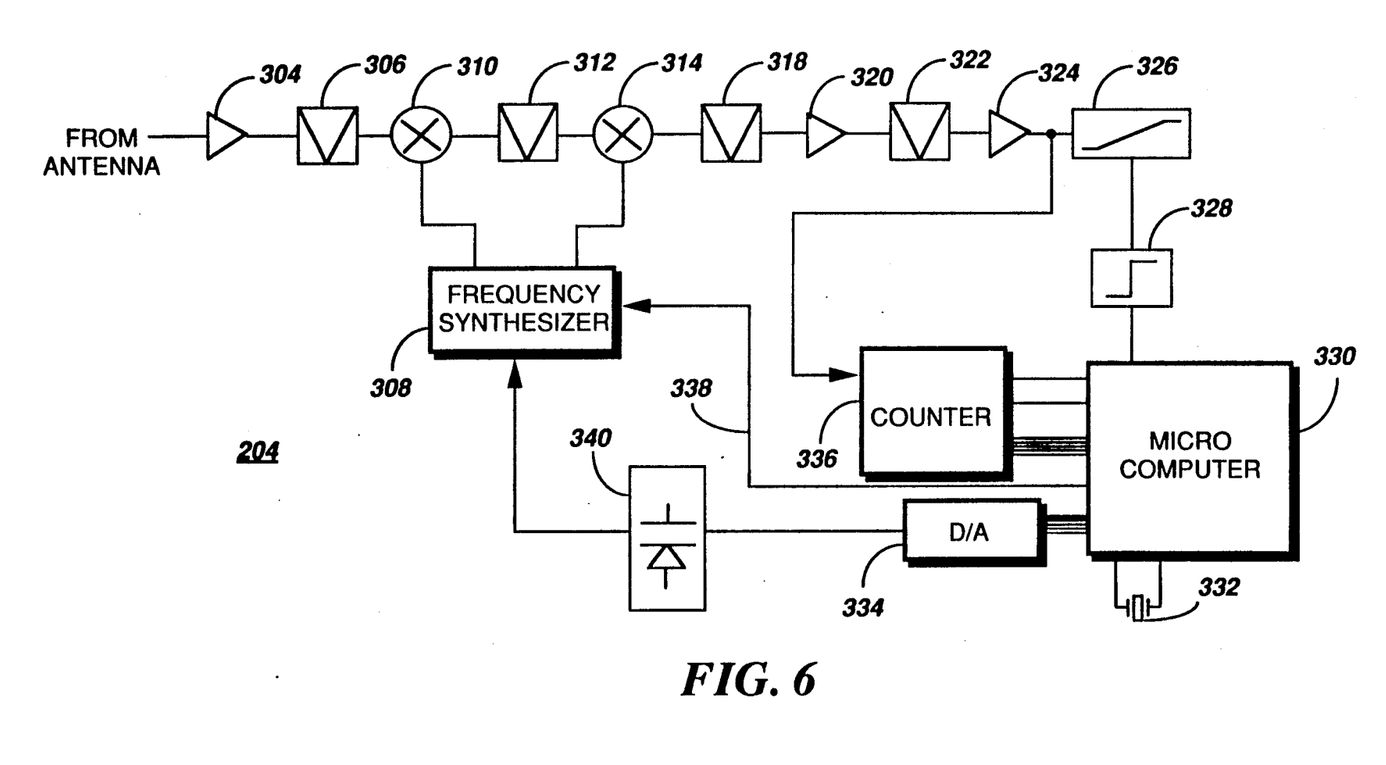
FIG. 6 is a block diagram of a receiver in accordance with a third embodiment of the invention.

Referring to FIG. 6, a third embodiment in accordance with the invention is illustrated. Again, the operation is similar to that discussed in the first embodiment in FIG. 3. The difference includes a varactor 340 inserted in the output from the D/A converter 334, and a output signal 338 with digital levels coupled to the frequency synthesizer 308. The varactor 340, upon receiving a correction voltage, adjusts (warps) the frequency synthesizer 308 in a conventional manner to produce minimum shifts in frequency. This configuration produces a high accuracy AFC.

Operationally, the varactor 340 is controlled by the D/A 334, and is used to adjust the frequency synthesizer 308. First, the digital signal 338 obtained from micro-computer 330 comprises the error of the received signal, and is used to adjusts the frequency synthesizer 308 to the nearest predefined step (course adjustment). Subsequently, the output of the D/A 334 is passed to the varactor 340 that is used to fine tune the frequency synthesizer 308. The AFC comprises a digital frequency synthesizer having a course synthesizer step adjustment and a fine-tuning correction step (varactor for warping the reference oscillator). Those skilled in the art will appreciate that the frequency synthesizer 308 may be replaced by a crystal oscillator coupled with the varactor 340. In this way, the AFC without reference to crystal oscillator tolerance, the received frequency may be corrected in a two step process to obtain a frequency accuracy in the range of plus-or-minus 0.1 to 0.03 ppm. This two step process produces a more accurate frequency by employing the technique of "course and fine" tunings to achieve near absolute frequency correction.

In summary, a selective call receiver 200 including an automatic frequency controller that determines the frequency of a received signal, and calculates a frequency error from the received signal. The frequency error is used to calculate a correction factor that is used to adjust the frequency of an oscillator in response to the determined error. In this way, the frequency stability of the circuit is be improved by changing the IF frequency without further improvement in the stability of the crystal oscillator.

We claim:

1. A paging receiver, comprising:
   means for receiving a paging signal including at least a pager address;
   means for comparing the pager address included in the paging signal to at least one address stored in a memory;
   an automatic frequency controller responsive to the comparing means
   for determining the frequency of the received paging signal when the paging address included in the paging signal correlates to the at least one address stored in the memory, and
   for determining a correction factor related to a frequency error of the received signal;
   oscillator control means for adjusting an oscillator frequency in response to the correction factor provided by the automatic frequency controller when the paging address included in the paging signal correlates to the at least one address stored in the memory; and
   annunciation means responsive to the comparing means for providing an indication of receiving the paging signal when the paging address included in the paging signal correlates to the at least one address stored in the memory.

2. The paging receiver according to claim 1 wherein the means for receiving includes means for synchronizing to the paging signal and the oscillator control means is responsive to the automatic frequency controller to adjust the oscillator frequency in response to a nominal value when synchronization was not achieved.

3. The paging receiver of claim 1, wherein the paging receiver includes means for displaying message data included in the paging message.

4. The paging receiver of claim 1, wherein the paging receiver includes means for storing a voice message included in the paging message and means for reproducing the stored voice message for presentation to a user of the paging receiver.

5. The paging receiver of claim 1, wherein the frequency of the paging signal is determined by means for measuring the mark and space transitions of the paging signal.

6. A paging receiver, comprising:
   means for receiving a radio frequency paging signal including at least a pager address;
   means for comparing the pager address included in the paging signal to at least one address stored in a memory;
   an automatic frequency controller responsive the comparing
   means for converting the radio frequency paging signal to an intermediate frequency signal and
   for determining the frequency of the intermediate frequency signal when the paging address included in the paging signal correlates to the at least one address stored in the memory, and including
   means for determining a frequency error from the received paging signal and calculating an off-set value based upon the received signal; and
   adjustable filter means for varying the filtering of the paging signal based on the calculated frequency off-set value when the paging address included in the paging signal correlates to the at least one address stored in the memory; and annunciation means responsive to the comparing means for providing an indication of receiving the paging signal when the paging address included in the paging signal correlates to the at least one address stored in the memory.

7. The paging receiver according to claim 6 wherein the means for receiving includes means for synchronizing to the paging signal and the adjustable filter means is responsive to the automatic frequency controller to vary the filtering of the paging signal in response to a nominal value when synchronization was not achieved.

8. In a paging receiver having an automatic frequency controller with an adjustable frequency oscillator, a method comprising the steps of:
  (a) receiving a paging signal including a paging receiver address;
  (b) comparing the paging receiver address included in the paging signal to at least one address stored in memory;
  (c) determining the frequency of the paging signal when the paging receiver address included in the paging signal correlates to at least one address stored in the memory and calculating a correction factor based upon the frequency of the paging signal;
  (d) varying the frequency of an adjustable frequency oscillator in accordance with the correction factor when the paging receiver address included in the paging signal correlates to at least one address stored in the memory; and
  (e) providing an indication of receipt of the paging signal when the paging receiver address included in the paging signal correlates to at least one address stored in the memory.

9. The method according to claim 5 wherein step (c) determines the frequency by counting the mark and space transitions of the paging signal.

10. The method according to claim 6 wherein the frequency determination of the signal is made after synchronization to the received paging signal and after the comparing means determines that the paging receiver address included in the paging signal correlates to the at least one address stored in the memory.

11. The paging receiver of claim 8, wherein the paging receiver includes means for displaying message data included in the paging message.

12. The paging receiver of claim 8, wherein the paging receiver includes means for storing a voice message included in the paging message and means for reproducing the stored voice message for presentation to a user of the paging receiver.

13. The paging receiver of claim 8, wherein the frequency of the paging signal is determined by means for measuring the mark and space transitions of the paging signal.

14. A paging receiver, comprising:
  means for receiving and synchronizing to a paging signal including a paging receiver address;
  means for comparing the paging receiver address included in the paging signal to at least one address stored in a memory;
  an automatic frequency controller responsive to the comparing means
  for counting the frequency of the received signal when the paging receiver address included in the paging signal correlates to the at least one address stored in the memory, and for determining a frequency error of the received paging signal and a correction factor;
  oscillator control means for adjusting an oscillator frequency in response to the correction factor when the paging receiver address included in the paging signal correlates to the at least one address stored in the memory, and for adjusting the oscillator frequency in response to a nominal value when synchronization to the paging signal is not achieved or when the paging receiver address included in the paging signal does not correlate to any of the addresses stored in the memory; and
  annunciation means responsive to the comparing means for providing an indication of receiving the paging signal when the paging address included in the paging signal correlates to the at least one address stored in the memory.

15. The paging receiver of claim 14, wherein the paging receiver includes means for displaying message data included in the paging message.

16. The paging receiver of claim 14, wherein the paging receiver includes means for storing a voice message included in the paging message and means for reproducing the stored voice message for presentation to a user of the paging receiver.

17. The paging receiver of claim 14, wherein the frequency of the paging signal is determined by means for measuring the mark and space transitions of the paging signal.

* * * * *